US005739697A

United States Patent [19]
Balyasny et al.

[11] Patent Number: 5,739,697
[45] Date of Patent: Apr. 14, 1998

[54] LOCKING MECHANISM FOR IC TEST CLIP

[75] Inventors: Marik Balyasny, Burbank; George Ray Hirvela, Corona, both of Calif.

[73] Assignee: ITT Corporation, New York, N.Y.

[21] Appl. No.: 557,787

[22] Filed: Nov. 13, 1995

[51] Int. Cl.$^6$ .................................................. G01R 31/02
[52] U.S. Cl. ........................... 324/755; 324/754; 439/912
[58] Field of Search ..................................... 324/754, 755, 324/761; 439/152, 331, 912.1, 70, 68, 264

[56] References Cited

U.S. PATENT DOCUMENTS

| | | | |
|---|---|---|---|
| 4,671,592 | 6/1987 | Ignasiak et al. | 439/331 |
| 4,750,890 | 6/1988 | Dube et al. | 439/152 |
| 4,996,476 | 2/1991 | Balyasny et al. | 324/754 |
| 5,180,976 | 1/1993 | Van Loan et al. | 324/754 |
| 5,477,161 | 12/1995 | Kardos et al. | 324/755 |
| 5,497,104 | 3/1996 | Balyasny | 324/755 |

Primary Examiner—Ernest F. Karlsen
Assistant Examiner—Anh Phung
Attorney, Agent, or Firm—Freilich Hornbaker Rosen

[57] ABSTRACT

A mechanism is provided as part of a test clip for locking the clip to the body of an integrated circuit device, at the corner regions of the IC body. The mechanism includes locking fingers (62, FIG. 4) that are formed of metal spring wire, with each finger having an upper part (84) fixed to a base (22) that closely engages an upper portion of the IC body, a middle part (84) that extends at a downward-axially outward incline, and a lower finger end (66) that engages a lower portion of the IC body. When a shaft (72) is pushed down against the biasing of a spring (74), the shaft moves down an actuator (64) that has prongs (80) which press against the middle parts of the locking fingers to deflect them radially inwardly, so the finger lower ends slide radially inwardly along grooves (112) formed in the base, to engage the lower portion of the IC body.

9 Claims, 5 Drawing Sheets

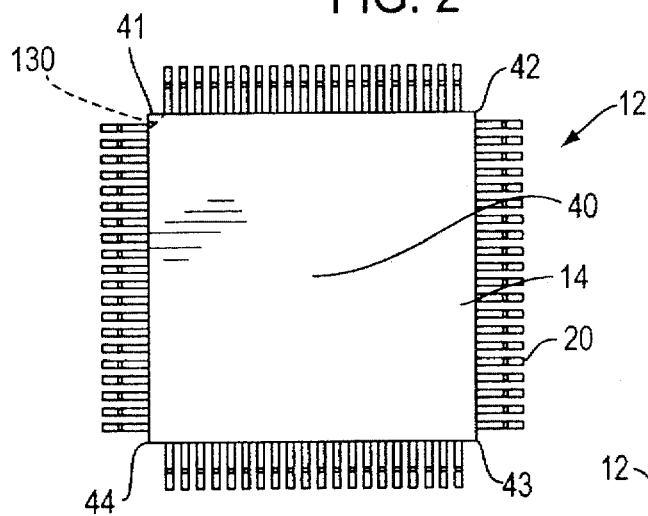
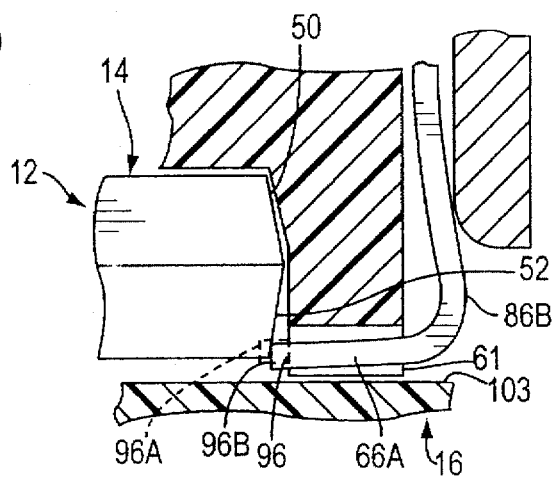
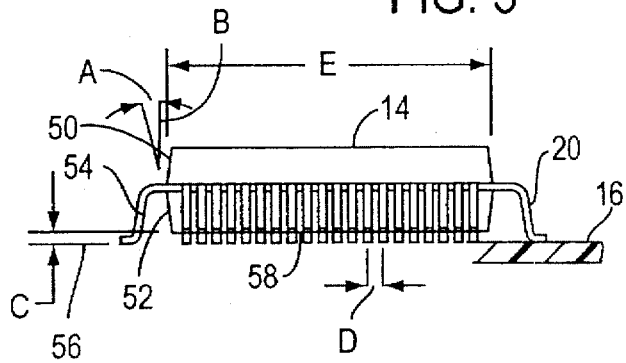
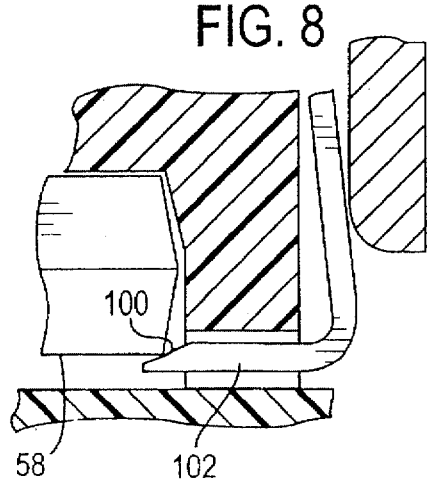
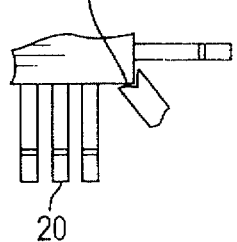

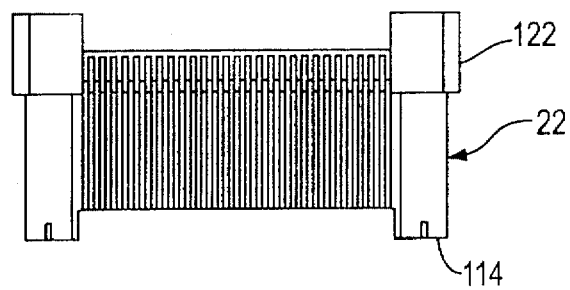
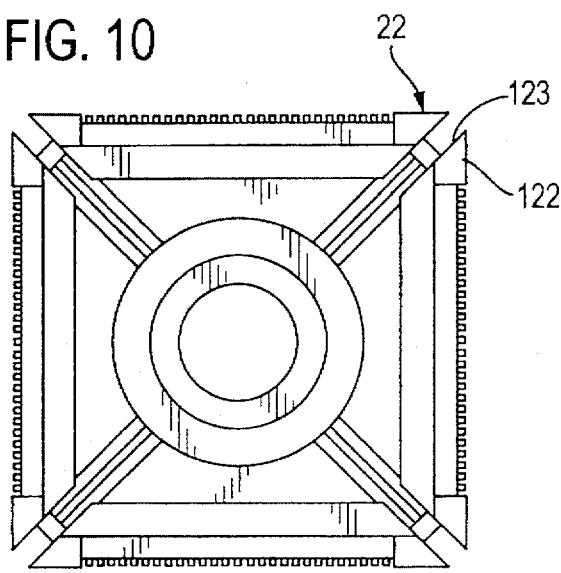
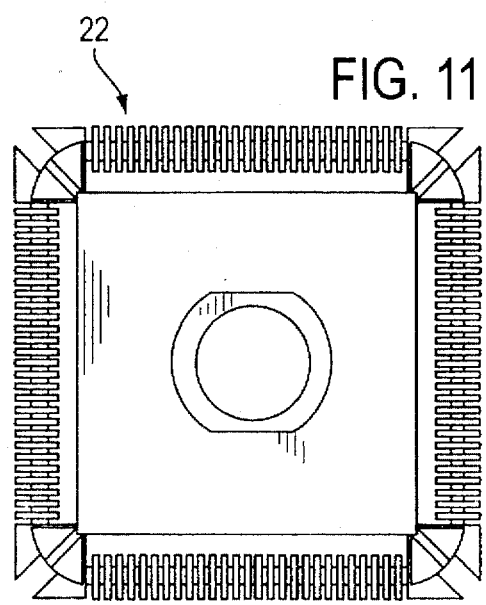
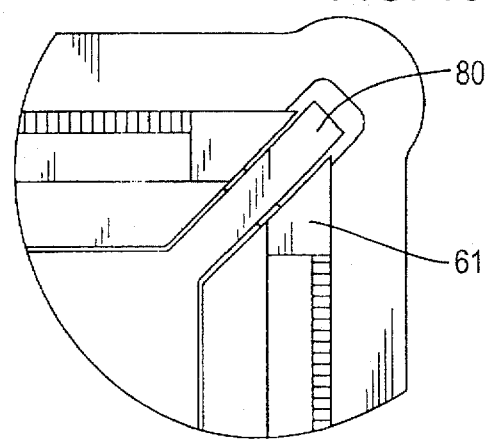

LOCKING MECHANISM FOR IC TEST CLIP

BACKGROUND OF THE INVENTION

One of the most popular IC (integrated circuit) devices is a QFP (quad flat pack) which has a rectangular, usually square, body as seen in a plan view, and which has leads extending from at least two and usually all four sides of the body down to a circuit board, where the leads are soldered to traces on the board. U.S. Pat. No. 4,996,476 describes a test clip that can engage this type of IC device, and which is held down to the device by friction of the multiple contacts of the test clip with the leads of the IC device. Because of the presence of cables that extend from the test clip to test instruments, it is necessary that the test clip be securely held to the IC device during a test. Reliance for test clip holding, solely on friction between the test clip contacts and the IC device leads, is often not satisfactory, especially because the friction may vary with the angles of inclination of the leads. There have been proposals to provide pivoting arms on a test clip, with handles at the top, and with springs urging lower ends of the arms towards each other to engage opposite corners of an IC body. However, there is often very little room available at the corner regions of the IC body and at corner portions of the clip lying beyond the contacts, and it is difficult to mount such arms with sufficient precision to assure reliable holding to an IC body. A locking mechanism for an IC test clip that was placed inside of the clip, whose lower portion was compact and which provided precise engagement of corner regions of an IC body to securely hold the test clip to the body, would be of value.

SUMMARY OF THE INVENTION

In accordance with one embodiment of the present invention, a test clip is provided with a compact lower portion which can reliably apply a large and predictable holding force for holding the test clip to the body of an IC (integrated circuit) device. The test clip includes a base with walls for closely engaging an upper portion of an IC body, and a plurality of locking fingers with lower finger ends that are each movable to engage a corner region at the lower portion of an IC body. Each locking finger has an upper part mounted on the base and a middle part extending between the upper and lower parts. An actuator can be moved to deflect the middle part of each finger to move the finger lower end inwardly to engage a lower portion of the IC body.

Each locking finger is preferably formed of resilient metal such as stainless still spring wire, to provide high strength in a small area, to fit into the corner regions of the IC bodies. The base has grooves on its bottom, which slidably guide the finger lower parts in movement. The actuator lies under a portion of a shaft that can be pressed down while a spring urges the actuator upwardly, to move down prongs of the actuator that deflect and move the locking fingers inwardly. When the shaft is moved fully downward, it is turned so a pin projecting from the shaft moves under a downwardly-facing shoulder on the base, to secure the clip in a lock-on position.

The novel features of the invention are set forth with particularity in the appended claims. The invention will be best understood from the following description when read in conjunction with the accompanying drawings.

BRIEF DESCRIPTION OF THE DRAWINGS

FIG. 2 is a plan view of a QFP (quad flat pack) type IC device.

FIG. 3 is a side elevation view of the IC device of FIG. 2.

FIG. 7 is an enlarged view of a portion of the test clip of FIG. 4, shown locking to a body of an IC device.

FIG. 7A is a top view of a modified embodiment of the test clip, showing a modified locking finger engaging the IC device body of FIG. 7.

FIG. 8 is a view similar to that of FIG. 7, showing another embodiment of the locking finger of FIG. 7.

FIG. 9 is a side elevation view of only the base of the clip of FIG. 5.

FIG. 10 is a top view of the base of FIG. 9.

FIG. 11 is a bottom view of the base of FIG. 9, and which is also shown in FIG. 6 as part of the test clip.

FIG. 16 is an enlarged view of a portion of the base of FIG. 10, with an actuator shown installed thereon.

DESCRIPTION OF THE PREFERRED EMBODIMENTS

Figure 1:
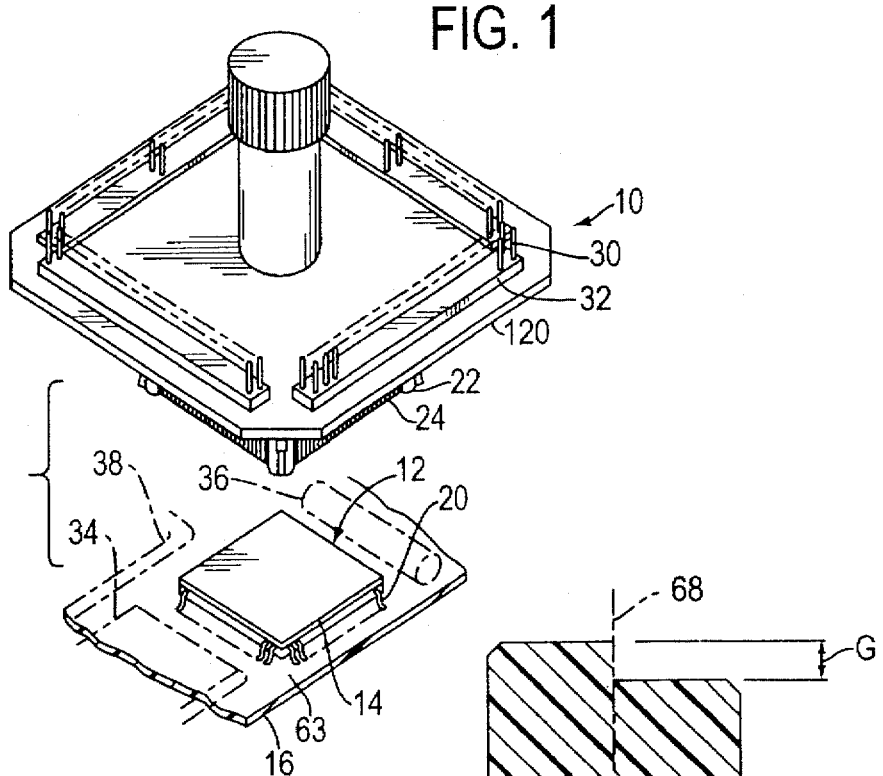
FIG. 1 is an exploded isometric view of a test clip of the present invention, showing it positioned to engage an IC device.

FIG. 1 shows a test clip 10 of the present invention, which is positioned above an IC (integrated circuit) device 12 to engage it. The IC device has a body 14 that lies closely above a circuit board 16, and has four rows of leads 20. The IC body 14 is of rectangular, and usually square shape, as seen in a plan view, and the leads 20 extend from each side of the body to conductive traces on the circuit board, to which the leads are soldered. The test clip 10 includes a base 22 that carries four rows of contacts 24 for engaging the leads 20 of the IC device. Each of the contacts 24 is connected to a pin 30 of one of four headers 32 on a board 120. Cables extending from test instruments, have connectors at their ends that mate with the pins 30, so that signals can be carried between the leads of the IC device and the instrument.

When the test clip 10 is mounted on the IC device 12, a reliably-predictable holding force of several pounds is desirable to assure that the test clip will not be tilted to one side by tension in a cable, and thereby lose contact with leads of the IC device. Some previous test clips relied upon frictional engagement of the test clip contacts 24 with the IC device leads 20 to provide such holding force. However, relying upon friction with the leads for the holding force often results in insufficient holding force. Modern circuits often have components such as those indicated at 34–38 which lie close to the IC device 12 that is to be tested, so any holding mechanism should be capable of being used in an environment where there is very little room around the IC device.

FIGS. 2 and 3 illustrate some details of a common IC device 12. The body has a vertical body axis 40 and has four corner regions 41–44. The area around each corner region that is not obstructed by leads 20 is limited, and can vary from one manufacturer of IC devices to another. As shown in FIG. 3, the body has upper and lower portions 50, 52 which are each typically inclined from the vertical as shown. The lower portion 52 is commonly inclined at an angle A from a vertical line B of 7°, although this varies from one manufacturer to another. Each lead 20 is of "gullwing" shape, with a largely vertical lead portion 54 extending down to a level 56 that is spaced a small distance C below a bottom 58 of the IC body 14. Such small standoff distance C is provided to assure that the body bottom 58 will not prevent the lower ends of the leads from engaging traces on the circuit board, but the standoff distance C varies from one manufacturer to another. The center-to-center distance D between leads varies, but can be as small as 0.25 mm (0.010 inch). For the particular IC device, body length E is 550 mils (one mil equal one-thousandth inch), the distance D is 25 mils, and the other dimensions are proportional thereto as illustrated in FIGS. 2–16.

Figure 6:
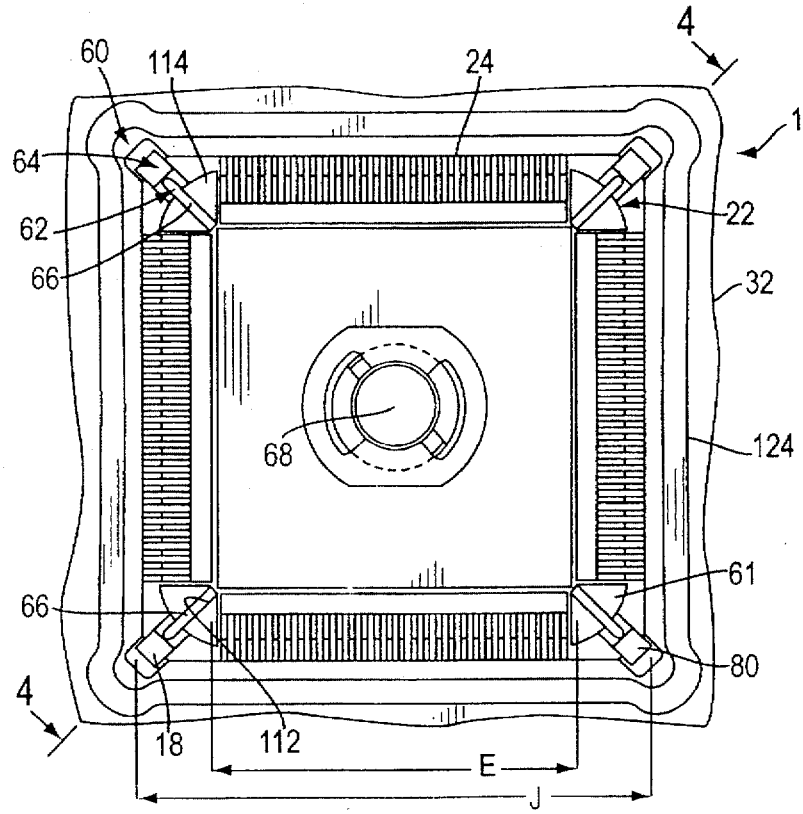
FIG. 6 is a bottom view of the test clip of FIG. 5, but with only a portion of the circuit board shown.
Figure 14:
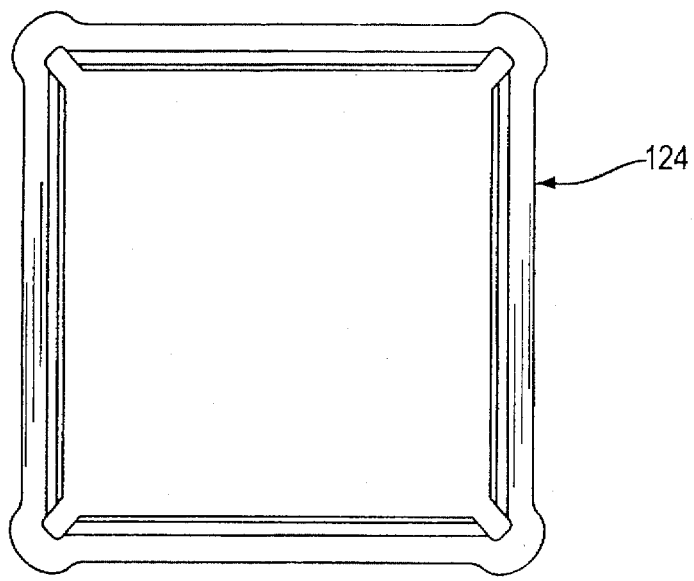
FIG. 14 is a plan view of the frame of the test clip of FIG. 4.

FIG. 6 is a bottom view of the IC test clip 10 showing four rows of contacts 24 for engaging the four rows of leads of the IC device. The base 22 has four corner wall portions in the form of legs 61 that can rest on the upper face 63 of the circuit board. A frame 124 lies a distance H (FIG. 4) of about 0.225 inch above the bottom 114 of the base legs, and is unlikely to interfere with nearby circuit components. For a cavity for engaging an IC body of width E of 0.550 inch, the base legs and actuator prongs 80 have a footprint width J (FIG. 6) of about 0.770 inch, or only about 40% more. FIG. 6 also shows four corner locking mechanisms 60 that each serve to lock the test clip to a corner portion of an IC body. Each locking mechanism includes a locking finger 62 and an actuator prong 64 for moving a lower end 66 of the finger largely radially inwardly, towards a vertical test clip axis 68 of the test device. A sectional view of the test clip taken on line 4—4 in FIG. 6, and showing two of the locking mechanisms 60, is shown in FIG. 4.

Figure 4:
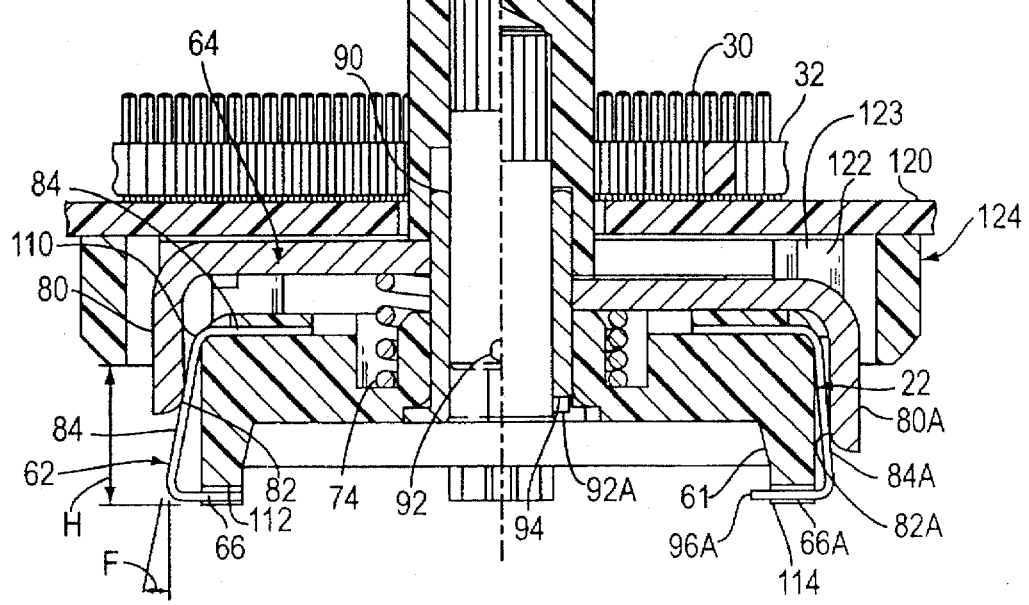
FIG. 4 is a sectional view of the test clip of FIG. 1, as taken on line 4—4 of FIG. 6, with the view being split along the axis of the clip, and with the left side of FIG. 4 showing the clip prior to locking to an IC device and the right side showing the clip after it is locked to an IC device.
Figure 5:
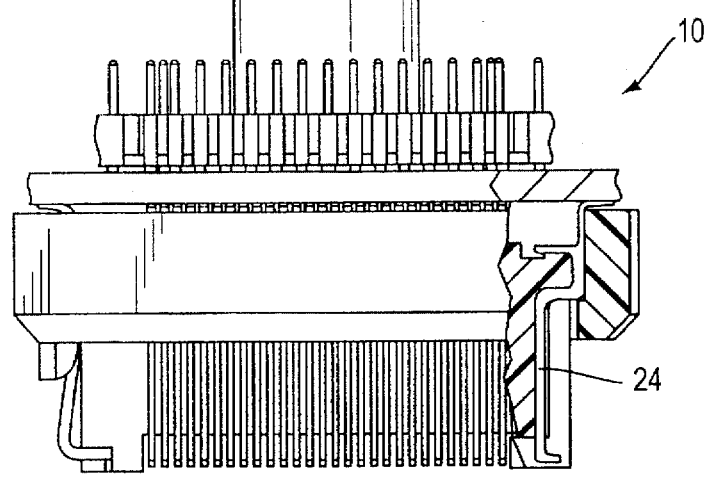
FIG. 5 is a partial sectional side elevation view of the test clip of FIG. 1.

In FIG. 4, the portion of the drawing to the left of the axis 68 shows the test clip in its unlocked configuration, while the portion to the right of the axis shows the test clip in its locked configuration. In the unlocked configuration, a handle 70 at the top of a shaft 72, lies in a raised position. The actuator 64 is also raised, and is biased upwardly by a spring 74. The actuator 64 has prongs 80 with camming surfaces 82 that engage the locking finger 62. The locking finger has a top 84 that is fixed to the top of the base 22, and has a middle 84 that extends largely downwardly from the middle to the lower end 66. Actually, the middle 84 extends at a downward-radially outward (with respect to axis 68) incline angle F, the particular angle shown being 12°. When the handle 70 is pushed downward by a distance G against the force of the spring 74, a lower portion of the shaft slides down around a bushing 90 to the position shown at the right half of FIG. 4. With the handle down, the handle is turned 45° so a pin shown at 92 at the left half of the figure, and which has moved down, rotates to the position 92A shown in the right half of the figure, along a groove formed near the bottom of the bushing, so the pin abuts a downwardly-facing shoulder 94 of the bushing, to keep the handle and actuator down. Of course, the handle can be turned back so the spring can push it up.

As the handle moves down, actuator 64 moves down until its prongs are at the position shown at 80A. During downward movement, the camming surface at 82A moves the inclined locking finger middle to the position shown at 84A. The finger has been deflected by elastic deformation of the finger middle at 84A, which results in the finger lower end at 66A being moved largely radially inwardly towards the axis 68. Such inward movement of the extreme radially inner tip at 96A of the locking finger lower end, allows the tip to press against the lower portion of an IC body.

FIG. 7 is an enlarged view showing the finger tip at 96B pressing against the lower portion 52 of the IC body 14. The middle of the locking finger is shown at 86B, wherein its bottom has been deformed outwardly, due to the tip at 96B engaging a body portion that lies close to the original position 96 of the tip. Thus, the locking finger can deform slightly to press against IC body lower portions of slightly different sizes or angles of incline, and still apply a considerable force thereto to lock the locking finger to the body so as to resist tilting or pulloff of the test clip from the IC device. FIG. 7A shows a locking finger inner tip 96N which is concave as seen in the top view, to center itself at the corner of an IC body.

FIG. 8 shows a modified tip 100, which is angled at a downward-radially inward incline, to be deflected under the body bottom 58. Such angling can result in potentially greater holding of the locking finger to the IC body. However, care has to be taken that the locking finger lower end 102 does not short circuit a pair of traces on the circuit board (as by coating the finger lower end with an insulative layer).

The locking finger shown at 62 in FIG. 4, is preferably formed of a resilient metal such as spring tempered stainless steel, although copper alloys and other engineering metals can be used. The particular wire of finger 62 is of round cross-section, with a diameter of 18 mils, although a wire of rectangular cross-section can be used. The metal wire provides high strength in a small width and height, to fit into the narrow corner regions of an IC body, within leads at the ends of the rows, while still providing high strength. The top 84 of the locking finger is fixed to the base, as by projecting it through a hole in the base as shown, and holding it in place with adhesive. The upper radially outer corner 110 of the locking finger lies closely against a corner of the base to prevent shifting of the finger. The finger lower end 66 is guided in radially inner and outer movement by walls of a groove 112 in the base. As seen in the sectional view of FIG. 4, the groove 112 has a large height to permit the finger lower end to tilt at a slight upward or downward incline. However, as shown in FIG. 6, the groove 112 closely surrounds the finger lower end 66 to prevent the lower end from tilting horizontally with respect to the walls of the groove. The finger lower end 66 initially lies slightly above bottoms 114 of the base legs 61.

Figure 12:
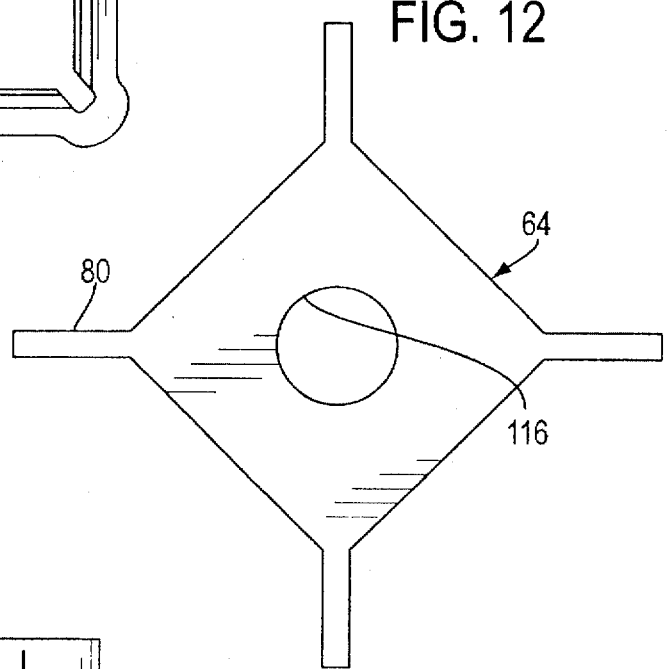
FIG. 12 is a plan view of the actuator of FIG. 4.
Figure 15:
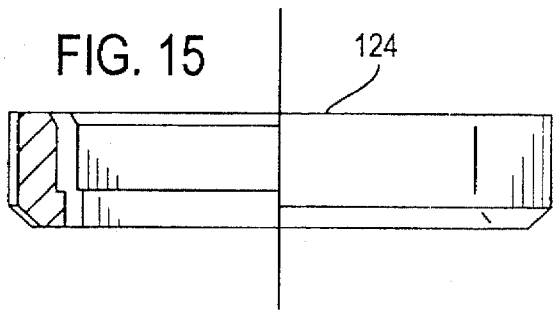
FIG. 15 is a partially sectional side view of the frame of FIG. 14.
Figure 13:
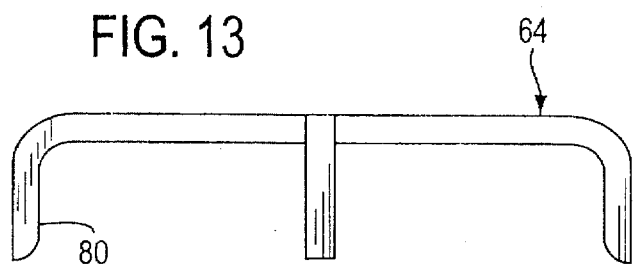
FIG. 13 is a side elevation view of the actuator of FIG. 12.

FIGS. 12 and 13 show the shape of the actuator 64, showing that it has four prongs 80 and a central hole 116 which slidably receives the bushing that guides the shaft in vertical movement.

Referring again to FIG. 4, it can be seen that the test clip includes an upper board 120 on which the headers 32 are mounted. The base 22 has four upward projections 122 that extend up to the upper board 120 to support it. The projections also form slots 123 that prevent turning of the actuator 64. A frame 124 is mounted on the upper board and surrounds much of the area between the upper board 120 and the base 22, to protect this area from damage.

Some IC devices of the type shown in FIG. 2, have a chamfer indicated at 130 at one of the four corners, to help in orientation of the IC device when it is installed. Applicant can construct a separate test clip for engaging IC devices with such a chamfer, by forming one of the actuator prongs so it initially extends slightly further in a radially inward direction.

Although terms such as "upper" and "lower" are used to describe the test clip and IC device as illustrated, they can be used in other orientations with respect to Earth's gravity.

Thus, the invention provides a test clip with contacts for engaging leads of an IC device of largely rectangular profile, which can more securely lock to the body of the IC device at its corner regions, and whose lower portion has a small profile. This is accomplished by the provision of locking fingers that each have an upper end mounted on a base of the test clip which has walls that closely engage an upper portion of the IC body. Each finger has a largely downwardly-extending middle part and a lower part that extends primarily radially inwardly. An actuator that is movable with respect to the base, can engage the finger middle parts to move the finger lower parts inwardly and against a corner region of the IC body. The finger is preferably formed of a length of spring metal wire, with the finger middle part being resiliently bent by the actuator to move the finger lower end inwardly. The middle part can extend at a downward-radially outward incline, and the actuator can move down to bend the finger middle parts closer to the vertical.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A test clip which can test an integrated circuit device having a body of substantially rectangular shape with a body axis and four sides and four corner regions, said IC body having an upper portion of predetermined size, a lower portion with a bottom that can rest close to an upper face of a circuit board, and a plurality of leads extending from each of a plurality of said body sides to said circuit board while leaving said corner region free of said leads, comprising:

a base which has an axis and walls for engaging an IC body, said base including legs for lying at the corner regions of the IC body and for supporting the test clip on the circuit board, said test clip including a plurality of locking fingers which are each movably coupled to said base and which each have body-engaging lower finger ends for engaging said IC body lower portion, with each finger end lying at one of said legs to engage an IC body corner region;

each of said locking fingers comprises a length of resilient material with an upper end that is fixed with respect to said base and with a middle which extends at a downward-axially outward incline, with said lower finger ends extending primarily horizontally and radially inwardly from said middle; and including an actuator which is movable with respect to said base to engage said middles of said locking fingers to resiliently bend them to deflect them primarily radially inwardly so said lower finger ends move radially inwardly.

2. The test clip described in claim 1 wherein:

said legs of said base have substantially radially-extending groove, and said lower finger ends slidably project through said grooves.

3. A method for locking a test clip to an integrated circuit device that has an IC body of substantially rectangular shape with four corner regions, as seen in a plan view, and with IC body upper and lower portions, with said integrated circuit device also having a plurality of leads and lying on a circuit board, comprising:

lowering a base that has base walls forming a cavity, so the cavity closely receives said body, and so downwardly extending legs of the base, which each have bottoms with grooves, lie immediately outside said body corner regions;

deflecting each of a plurality of fingers that have lower finger ends lying in said grooves, to move said finger ends primarily radially inwardly along said grooves and against said body lower portion.

4. The method described in claim 3 wherein:

said fingers are each formed of resilient material and each finger includes an upper part that is fixed with respect to said base and a middle extending between said upper and lower parts, and said step of deflecting includes moving said middle primarily radially inwardly to bend it to move said finger lower ends primarily radially inwardly.

5. The method described in claim 3 wherein:

said step of deflecting includes pushing down a shaft and an actuator that lies under a portion of said shaft and that has prongs that are each positioned to deflect one of said fingers, against an upward force applied by a coil spring lying between said base and said actuator;

with said shaft pushed down, turning said shaft to move a pin on said shaft under a shoulder on said base to lock said shaft in a downward position, while preventing turning of said actuator.

6. A test clip which has a clip axis and which can be coupled to an integrated circuit device having a body of substantially rectangular shape with a body axis and four body sides and four corner regions, said IC body having an upper portion of predetermined size, a lower portion with a bottom that can rest close to an upper face of a circuit board, and a plurality of leads extending from each of a plurality of said body sides to said circuit board while leaving at least some of said corner regions free of said leads, comprising:

a base which has walls for engaging the upper portion of an IC body, said base including corner wall portions for lying at the corner regions of the IC body with said corner regions having grooves, said test clip including a plurality of locking fingers which are each movably coupled to said base and which each have body-engaging lower finger ends for engaging said IC body lower portion, with each lower finger end being slidably received in one of said grooves to engage an IC body corner region;

said locking fingers are each formed of a length of resilient material, with each locking finger having an upper part mounted on said base and a middle part extending at a downward-radially outward incline to said clip axis and connecting said upper part to said lower finger end, and said test clip includes an actuator that is vertically slidable with respect to said base to move thereon and which is positioned to deflect each finger middle part to resiliently deform it and thereby move the lower finger end along one of said grooves largely toward said axis to engage the lower portion of the IC body at a corner region thereof.

7. The test clip described in claim 6, including:

a shaft which has an upper end forming a handle and which is vertically slidable together with said actuator, between upward and downward positions with respect to said base;

a spring urging said shaft and actuator upwardly, said shaft being rotatable about a vertical axis and being lockable in said downward position.

8. A test clip which can test an integrated circuit device having a body of substantially rectangular shape with a body axis and four sides and four corner regions, said IC body having an upper portion of predetermined size, a lower portion with a bottom that can rest close to an upper face of a circuit board, and a plurality of leads extending from each of a plurality of said body sides to said circuit board while leaving said corner region free of said leads, comprising:

a base which has an axis and walls for engaging an IC body, said base including legs for lying at the corner regions of the IC body with each of said legs having a largely radially extending groove, said test clip including a plurality of locking fingers which are each movably coupled to said base and which each have body-engaging lower finger ends for engaging said IC body lower portion, with each finger end lying being slidably received in one of said grooves to engage an IC body corner region;

actuator means moveable on said base to deflect said locking fingers to slide their lower ends radially inwardly along said grooves.

9. The test clip described in claim 8 wherein:

said locking fingers are resilient, and said actuator means is constructed to resiliently bend said locking fingers to slide their lower ends radially inwardly.

* * * * *